(12) United States Patent
Hass et al.

(10) Patent No.: US 6,215,668 B1
(45) Date of Patent: Apr. 10, 2001

(54) EXPANSION CARD RETAINING DEVICE

(75) Inventors: Kenneth A. Hass; David M. Pryal; Steven L. Sands; Ralph Jensen, all of Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/274,662

(22) Filed: Mar. 23, 1999

(51) Int. Cl.$^7$ ........................................................ H05K 7/14
(52) U.S. Cl. ........................ 361/759; 361/754; 361/683; 361/801; 24/553; 70/58
(58) Field of Search ................................. 361/754, 759, 361/801, 802, 825, 683; 439/377; 24/521–571; 70/58; 248/674; 312/183

(56) References Cited

U.S. PATENT DOCUMENTS

| | | | |
|---|---|---|---|
| 4,534,608 | * 8/1985 | Scott et al. ............................ | 439/345 |
| 4,873,614 | * 10/1989 | Lichensperger ...................... | 361/732 |
| 5,317,483 | 5/1994 | Swindler ............................... | 361/801 |
| 5,373,133 | 12/1994 | Brockway et al. ................... | 200/335 |
| 5,398,156 | 3/1995 | Steffes et al. ........................ | 361/683 |
| 5,483,420 | 1/1996 | Schiavini ............................. | 361/707 |
| 5,575,546 | 11/1996 | Radloff ................................ | 312/183 |
| 5,601,349 | 2/1997 | Holt .................................... | 312/265.6 |
| 5,640,309 | 6/1997 | Carney et al. ....................... | 361/801 |
| 5,650,922 | 7/1997 | Ho ....................................... | 361/799 |
| 5,673,175 | 9/1997 | Carney et al. ....................... | 361/686 |
| 5,748,453 | 5/1998 | Carney et al. ....................... | 361/801 |
| 5,774,330 | 6/1998 | Melton et al. ....................... | 361/683 |
| 5,991,983 | * 11/1999 | Kohler et al. ........................ | 24/573.1 |

* cited by examiner

Primary Examiner—Jayprakash N. Gandhi
(74) Attorney, Agent, or Firm—Skjerven Morrill MacPherson, LLP

(57) ABSTRACT

An expansion card retention system and method. In one embodiment, the expansion card retention system includes an expansion card retaining unit which has a vertical axis, an extended member, and a vertical-axis extended member pressure application device operably connected to the extended member. In another embodiment, a data processing system includes the expansion card retention system. In yet another embodiment, the method includes securing an expansion card via the application of a wedging force.

39 Claims, 11 Drawing Sheets

EXPANSION CARD RETAINING DEVICE

BACKGROUND OF THE INVENTION

1. Field of the Invention

The present invention relates, in general, to a method and system to be utilized in data processing systems.

2. Description of the Related Art

Data processing systems are systems that manipulate, process, and store data and are notorious within the art. Personal computer systems, and their associated subsystems, constitute well known species of data processing systems.

Personal computer systems typically include a motherboard for mounting at least one microprocessor and other application specific integrated circuits (ASICs), such as memory controllers, input/output (I/O) controllers, and the like. Most motherboards include slots for additional adapter cards to provide additional function to the computer system. Typical functions that a user might add to a computer include additional microprocessors, additional memory, fax/modem capability, sound cards, graphics cards, or the like. The slots included on the motherboard generally include in-line electrical connectors having electrically conductive lands which receive exposed tabs on the adapter cards. The lands are connected to wiring layers, which in turn are connected to a bus that allows the cards to communicate with the microprocessor or other components in the system.

A personal computer system may include many different types of buses to link the various components of the system. Examples of such buses are a "local bus" which connects one or more microprocessors to the main memory, an Industry Standard Architecture (ISA) bus for sound cards and modems, a Universal Serial Bus (USB) for pointing devices, scanners, and digital cameras, a Fire Wire (IEEE-1394) for digital video cameras and high-speed storage drives, and a Peripheral Component Interconnect (PCI) bus for graphics cards, SCSI adapters, sound cards, and other peripheral devices such as isochronous devices, network cards, and printer devices.

Personal computer systems utilize circuit carrying boards housed in the computer's chassis as platforms to secure and interconnect individual electronic components. In order to provide consumer flexibility, these circuit boards are frequently designed to accommodate additional circuit boards, or expansion cards, to provide additional and/or alternative functionality. For example, many personal computer circuit boards are designed with expansion card slots for standard bus interfaces, such as ISA (industry Standard Architecture), EISA (Extended Industry Standard Architecture), and Peripheral Component Interconnect (PCI), into which expansion cards for peripheral devices, such as hard disk controllers, tape controllers, modems and other I/O controllers, may be connected. Many of these expansion cards require connections to devices and equipment external to the computer chassis itself. Accordingly, access points in the computer chassis adjacent to the expansion card connectors are provided to allow for connection between the expansion cards and peripheral devices.

When expansion cards are inserted into expansion card slots, it is important that the expansion cards be held substantially immobile. This is necessary to ensure that appropriate electrical connections are maintained. Those skilled in the art will recognize that if the expansion cards are not held to be substantially immobile, a likelihood exists that the electrical connections of the expansion cards will be interrupted, which can cause errors, malfunctions, and even damage to a data processing system with which the expansion cards are being utilized.

One expectation by modern users when expansion slots are utilized is that various expansion cards can be quickly changed out, or "swapped," when necessary, since it is often necessary to power down a data processing system for a time in order to change out expansion cards. Such down time translates into data processing system unavailability. Thus, while it is important that expansion cards be held substantially immobile within their respective slots, it is also important that any mechanism securing the expansion cards allow for quick and easy release.

Early methods of securing expansion cards recognized the need for immobility, but did not recognize the need for quick-release of the expansion cards. These early methods actually secured the card via a screw which affixed the expansion card to a chassis, or expansion card cage, to which the expansion card slot was affixed. More recent methods have recognized the need for quick release of the expansion cards. These more recent methods utilize plastic clips which provide the necessary quick release functionality.

While the plastic clips provide quick-release functionality, they are notably deficient in holding expansion cards immobile within their slots. With reference now to FIG. 1, depicted is a related art manner of securing an expansion card. Illustrated is that contained within data processing system unit 122 is expansion card latch 100 intended to hold an expansion card, such as expansion card 104, immobile within expansion card chassis 102. When expansion card latch 100 is in its locked position, the expectation is that the face (not shown) of expansion card latch 100 will press upon a tab 108 of expansion card 104 (or expansion card filler panel if expansion card 104 not present) such that expansion card 104 will be held to be substantially immobile.

Those skilled in the art will recognize that the expectation that expansion card 104 will be held immobile is based upon an assumption that expansion card 104 will be of a size such that tab 108 of expansion card 104 will be such that it will be substantially proximate to the face (not shown) of expansion card latch 100 such that expansion card latch 100 may secure expansion card 104 to be substantially immobile. However, those skilled in the art will recognize that size and thicknesses of expansion card tabs vary within the industry, dependent upon manufacturer. In addition, size and thickness of different expansion card tabs also vary from the same manufacturer due to variances in manufacturing. As will be shown, the too-thin tabs will often give rise to substantial slack, or "play," resulting from empty space between the face (not shown) of expansion card latch 100 and tab 108 of expansion card 104, and the too-thick cards will often create an inability for the expansion card latch 100 to lock into place and perform its function.

Referring now to FIG. 2, shown is an expanded isolated view of expansion card latch 100. It can be seen that each expansion card latch 100 rotates about horizontal axis 200 such that face 201 moves down to abut tab 108 of expansion card 104. Depicted is that when release lever 204 clears edge 206 of expansion card latch orifice 208, release lever 204 springs into a position such that expansion card latch 100 cannot move away from the card. This constitutes the "latched" position of expansion card latch 100.

Due to the fact that expansion card latch 100 rotates about horizontal axis 200, those skilled in the art will recognize that card latch 100 is not able to maintain consistent tension between cards with varying thicknesses of mounting brackets. That is, if tab 108 of expansion card 104 is too thin, face 201 will not abut tab 108 with sufficient force to hold expansion card 104 secure in its slot. Conversely, if tab 108 of expansion card 104 is too thick, then release lever 204 will not be able to clear edge 206 of expansion card latch orifice 208, and thus expansion card latch 100 will not be able to lock into a fixed position to secure expansion card 104.

Both the related art problems noted can result in sub-optimal system performance. It has been found empirically that if tab 108 is of less thickness than that appropriate to expansion card latch 100 excessive movement of the card will often result. Those skilled in the art will recognize that such movement can give rise to interruption of the electrical connections of expansion card 104, which can thereby result in sub-optimal data processing system performance. It has also been found empirically that if tab 108 is of greater thickness than that appropriate to expansion card latch 100, the expansion card latch 100 will not be able to lock into a fixed position, which will leave expansion card 104 unsecured, and thus allow expansion card 104 to move freely. Those skilled in the art will recognize that such movement can give rise to interruption of the electrical connections of expansion card 104, which can thereby result in sub-optimal data processing system performance.

Notwithstanding the foregoing, it has been found empirically that expansion card latch 100 is particularly prone to bending and/or breaking when attempt is made to depress release lever 204 and retract expansion card latch 100. That is, it is necessary to depress release lever 204 such that it clears edge 206 and such that face 201 can be retracted up and way from tab 108. Unfortunately, it is common for the human user to mistime the depression of release lever 204 and attempt to retract face 201 without having release lever 204 properly retracted. This often results in the bending or breaking of expansion card latch 100, in that the latch is typically made from relatively brittle plastic which is easily bent and/or broken. This too constitutes a significant problem.

In light of the foregoing, it is apparent that a need exists in the art for a method and system which will secure expansion cards within expansion slots such that the expansion cards are substantially immobile and such that the expansion cards can be quickly released. A need also exists for the method and system to be relatively rugged and not prone to breakage.

SUMMARY OF THE INVENTION

An expansion card retention system and method have been invented which secure expansion cards within expansion slots such that the expansion cards are substantially immobile and such that the expansion cards can be quickly released. The method and system are relatively rugged and not prone to breakage. In one embodiment, the expansion card retention system includes an expansion card retaining unit which has a vertical axis, an extended member, and a vertical-axis extended member pressure application device operably connected to the extended member. In another embodiment, a data processing system includes the expansion card retention system. In yet another embodiment, the method includes securing an expansion card via the application of a wedging force.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The following sets forth a detailed description of the best contemplated mode for carrying out the multiple independent inventions described herein. The description is intended to be illustrative and should not be taken to be limiting. In addition, the following detailed description has been divided into sections (e.g., sections I–II) in order to highlight the invention described herein; however, those skilled in the art will appreciate that such sections are merely for illustrative focus, and that the invention herein disclosed typically draws its support from multiple sections. Consequently, it is to be understood that the division of the detailed description into separate sections is merely done as an aid to understanding and is in no way intended to be limiting.

I. Environment

Figure 1:
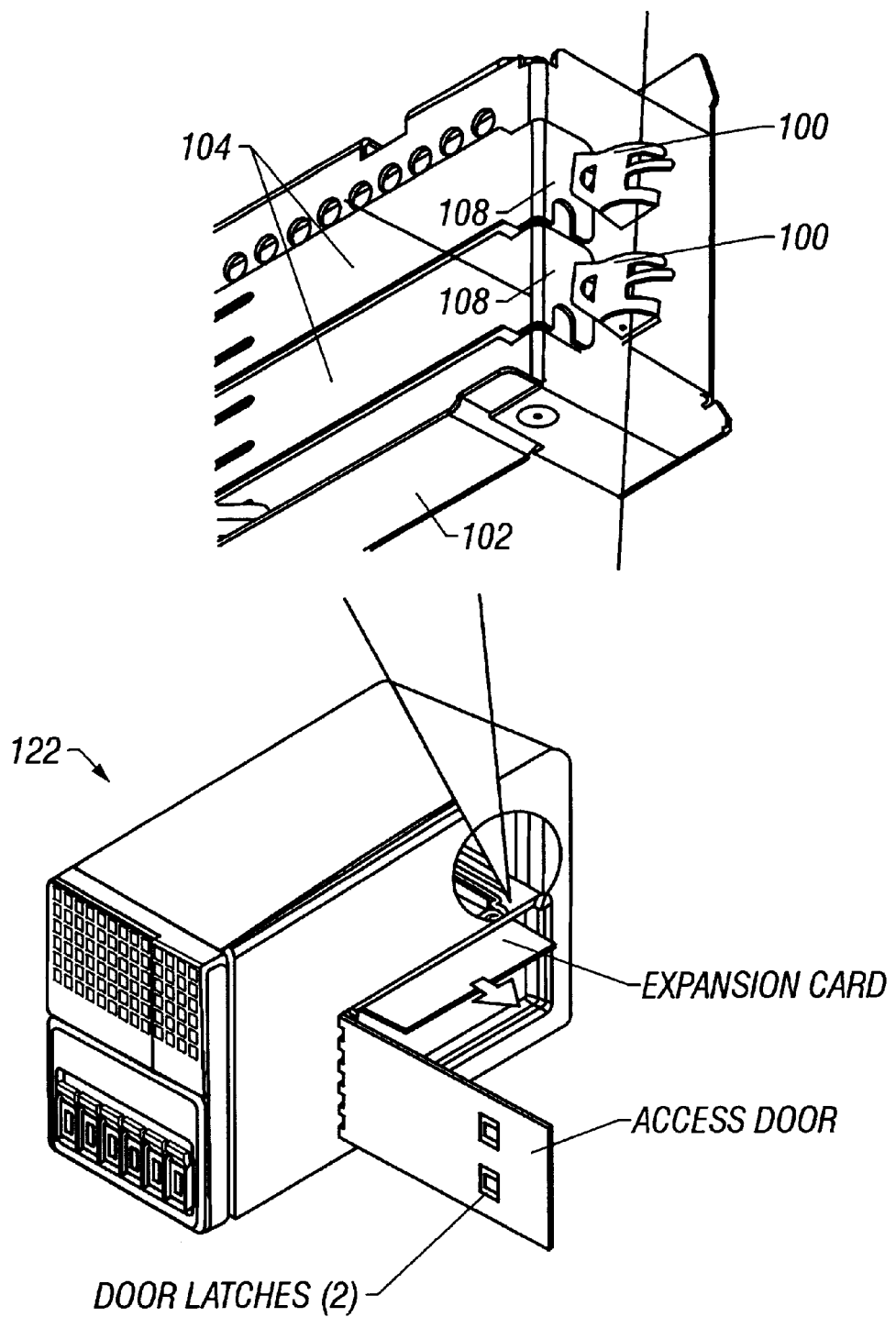
FIG. 1 depicts a related-art manner of securing an expansion card.
Figure 2:
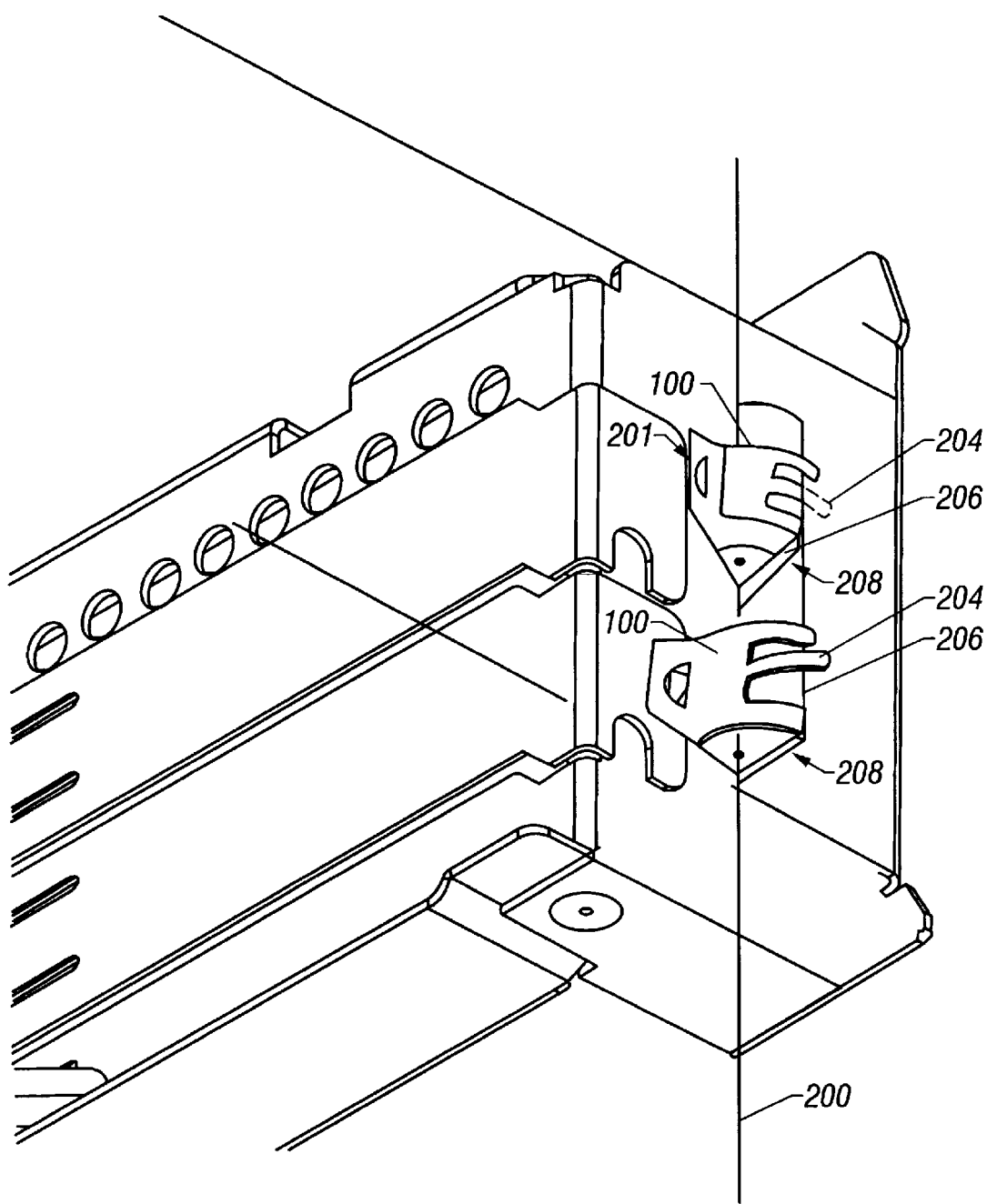
FIG. 2 illustrates an expanded isolated view of a related-art expansion card latch.
Figure 3:
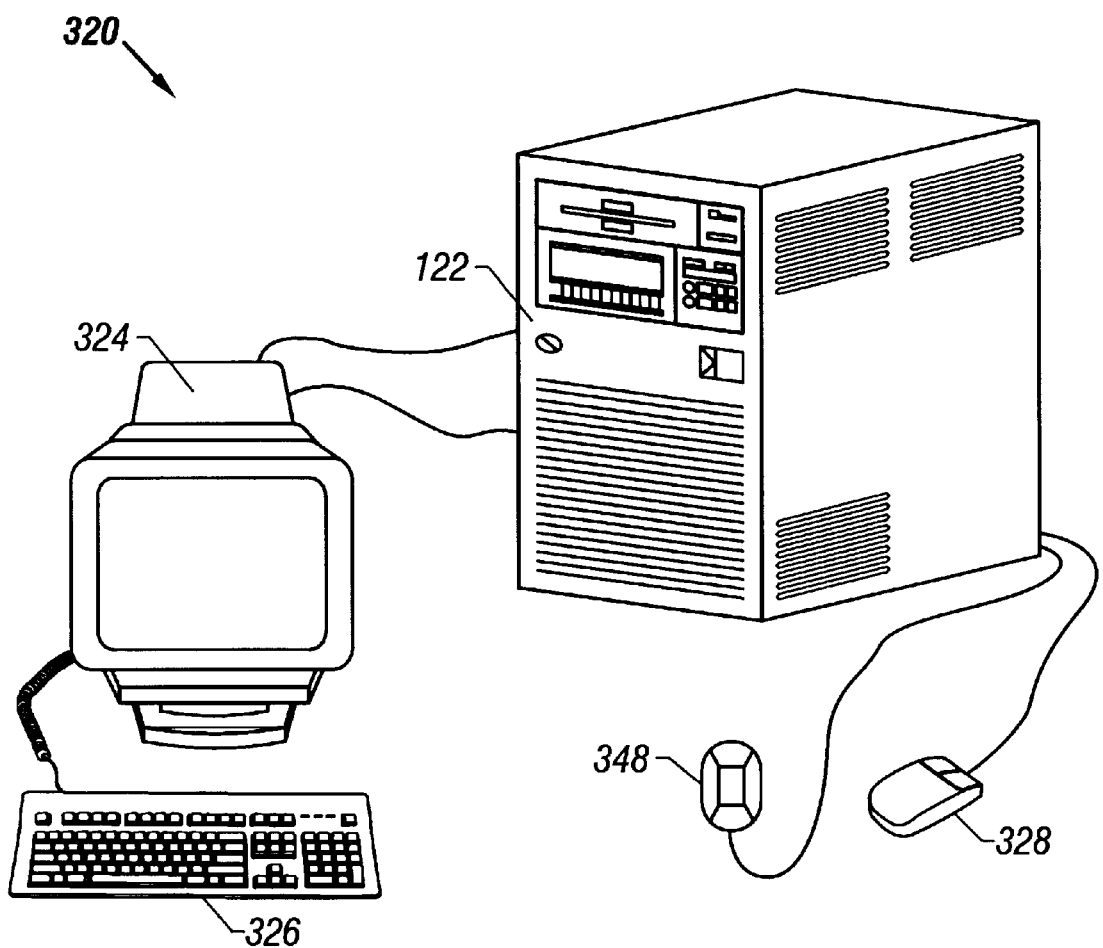
FIG. 3 depicts a pictorial representation of a data-processing system which can be utilized in accordance with the method and system of an illustrative embodiment of the present invention.

With reference now to the figures and in particular with reference now to FIG. 3, there is depicted a pictorial representation of a data-processing system which can be utilized in accordance with the method and system of an illustrative embodiment of the present invention. A data processing system 320 is depicted which includes a system unit 122, a video display terminal 324, a keyboard 326, a mouse 328, and a microphone 348. Data processing system 320 may be implemented utilizing any suitable computer such as an IBM-compatible or an Apple-compatible personal computer.

Figure 4:
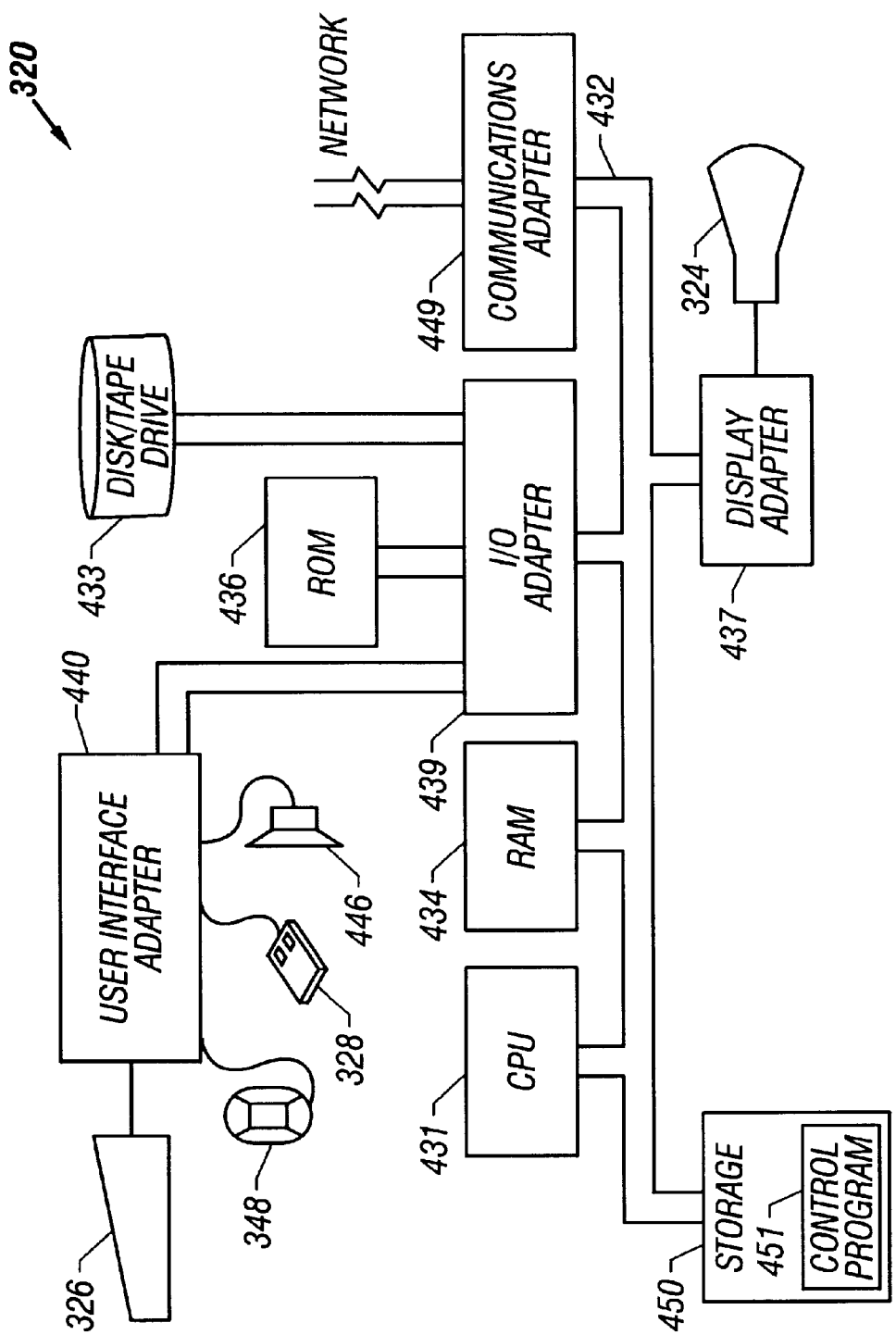
FIG. 4 illustrates a representative hardware environment, which can be utilized in accordance with the method and system of an illustrative embodiment of the present invention.

FIG. 4 is an illustration of a representative hardware environment, which incorporates a graphical user interface, which can be utilized in accordance with the method and system of an illustrative embodiment of the present invention. FIG. 4 depicts selected components in data processing system 320 in which an illustrative embodiment of the present invention may be implemented. Data processing system 320 includes a Central Processing Unit ("CPU") 431, such as a conventional microprocessor, and a number of other units interconnected via system bus 432. Such components and units of computer 320 can be implemented in a system unit such as system unit 122 of FIG. 3. Computer 320 includes random-access memory ("RAM") 434, read-only memory ("ROM") 436, display adapter 437 for connecting system bus 432 to video display terminal 324, and I/O adapter 439 for connecting peripheral devices (e.g., disk and tape drives 433) to system bus 432. Video display terminal 324 is the visual output of computer 320, which can be a CRT-based video display well-known in the art of computer hardware. However, with a portable or notebook-based computer, video display terminal 324 can be replaced with an LCD-based or a gas plasma-based flat-panel display. Computer 320 further includes user interface adapter 440 for connecting keyboard 326, mouse 328, speaker 446, microphone 348, and/or other user interface devices, such as a touch screen device (not shown), to system bus 432 through I/O adapter 439. Communications adapter 449 connects computer 320 to a data-processing network.

Any suitable machine-readable media may retain the graphical user interface, such as RAM 434, ROM 436, a magnetic diskette, magnetic tape, or optical disk (the last three being located in disk and tape drives 433). Any suitable operating system and associated graphical user interface (e.g., Microsoft Windows) may direct CPU 431. Other technologies can also be utilized in conjunction with CPU 431, such as touch-screen technology or human voice control. In addition, computer 320 includes a control program 451 which resides within computer storage 450. Control program 451 contains instructions that when executed on CPU 431 carries out the operations depicted in any examples, state diagrams, and flowcharts described herein.

Those skilled in the art will appreciate that the hardware depicted in FIG. 4 may vary for specific applications. For example, other peripheral devices such as optical disk media, audio adapters, or programmable devices, such as PAL or EPROM programming devices well-known in the art of computer hardware, and the like may be utilized in addition to or in place of the hardware already depicted.

Those skilled in the art will recognize that data processing system 320 can be described in relation to data processing systems which perform essentially the same functionalities, irrespective of architectures. As an example of such, an alternative partial architecture data processing system 320 is set forth in FIG. 5.

Figure 5:
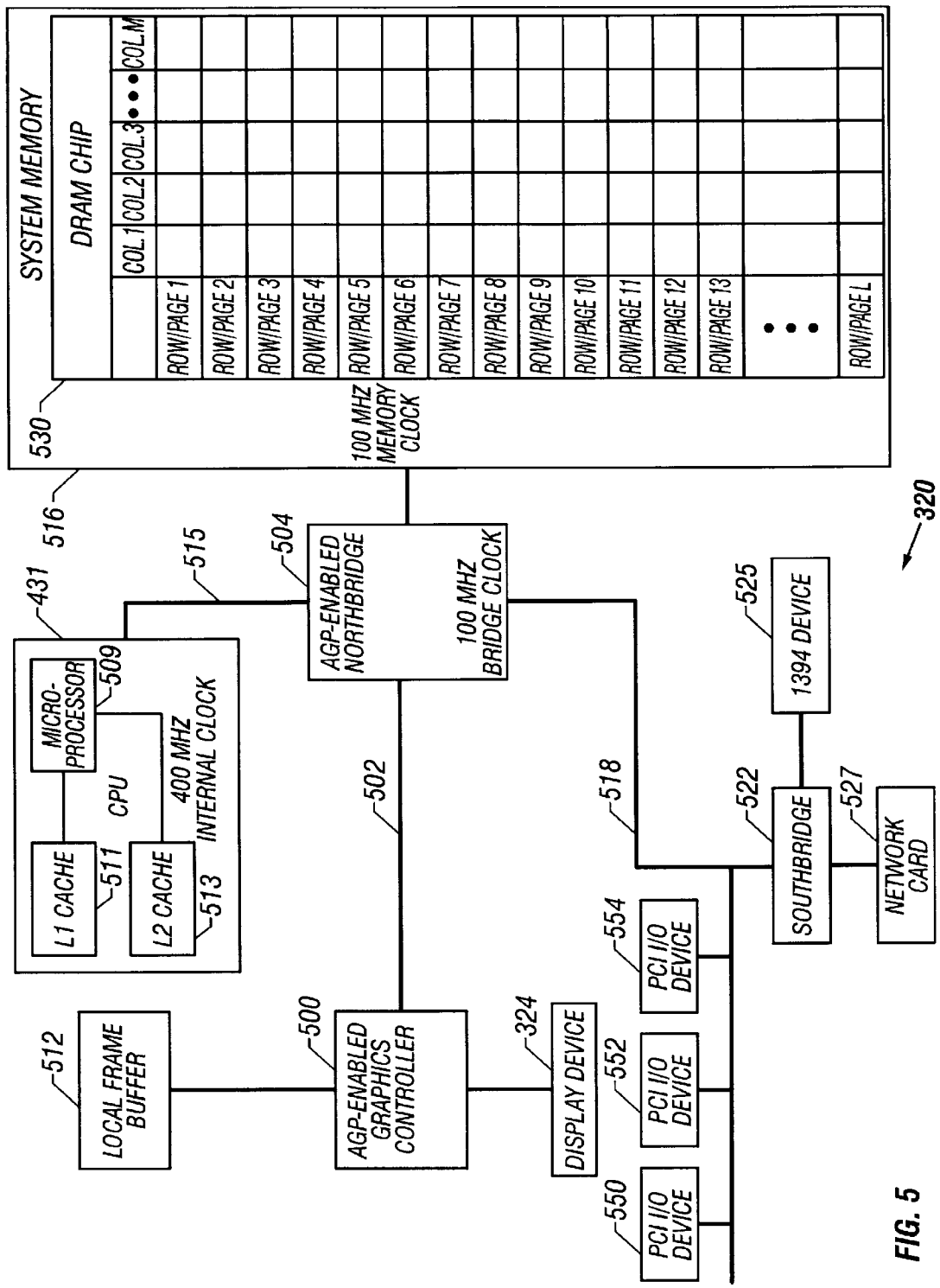
FIG. 5 shows a high-level component diagram depicting a data processing system which illustrates another environment wherein one or more embodiments of the present invention may be practiced.

Referring now to FIG. 5, shown is a high-level component diagram depicting a partial data processing system 320 which illustrates another environment wherein one or more embodiments of the present invention may be practiced. Shown are AGP-enabled graphics controller 500, AGP interconnect 502 (a data bus), and AGP-enabled Northbridge 504. Not shown, but deemed present is an AGP-enabled operating system. The term AGP-enabled is intended to mean that the so-referenced components are engineered such that they interface and function under the standards defined within the AGP interface specification (Intel Corporation, *Accelerated Graphics Port Interface Specification,* Revision 1.0 (Jul. 31, 1996)). Further depicted are video display device 324, local flame buffer 512, Central Processing Unit (CPU) 431 (wherein are depicted microprocessor 509, L1 Cache 511, and L2 Cache 513), CPU bus 515, system memory 516, Peripheral Component Interconnect (PCI) bus 518, various PCI Input-Output (I/O) devices 550, 552, and 554, Southbridge 522, 1394 Device 525, and network card 527.

The foregoing components and devices are used herein as examples for sake of conceptual clarity. As for (non-exclusive) examples, CPU 431 is utilized as an exemplar of any general processing unit, including but not limited to multiprocessor units; CPU bus 515 is utilized as an exemplar of any processing bus, including but not limited to multiprocessor buses; PCI devices 550–554 attached to PCI bus 518 are utilized as an exemplar of any input-output devices attached to any I/O bus; AGP Interconnect 502 is utilized as an exemplar of any graphics bus; AGP-enabled graphics controller 500 is utilized as an exemplar of any graphics controller, Northbridge 504 and Southbridge 522 are utilized as exemplars of any type of bridge; 1394 device 525 is utilized as an exemplar of any type of isochronous source; and network card 527, even though the term "network" is used, is intended to serve as an exemplar of any type of synchronous or asynchronous input-output cards. Consequently, as used herein these specific exemplars are intended to be representative of their more general classes. Furthermore, in general, use of any specific exemplar herein is also intended to be representative of its class and the non-inclusion of such specific devices in the foregoing list should not be taken as indicating that limitation is desired.

Generally, each bus utilizes an independent set of protocols (or rules) to conduct data (e.g., the PCI local bus specification and the AGP interface specification). These protocols are designed into a bus directly and such protocols are commonly referred to as the "architecture" of the bus. In a data transfer between different bus architectures, data being transferred from the first bus architecture may not be in a form that is usable or intelligible by the receiving second bus architecture. Accordingly, communication problems may occur when data must be transferred between different types of buses, such as transferring data from a PCI device on a PCI bus to a CPU on a CPU bus. Thus, a mechanism is developed for "translating" data that are required to be transferred from one bus architecture to another. This translation mechanism is normally contained in a hardware device in the form of a bus-to-bus bridge (or interface) through which the two different types of buses are connected. This is one of the functions of AGP-enabled Northbridge 504, Southbridge 522, and other bridges shown in that it is to be understood that such can translate and coordinate between various data buses and/or devices which communicate through the bridges.

II. Expansion Card Retaining Apparatus and Process

Figure 6:
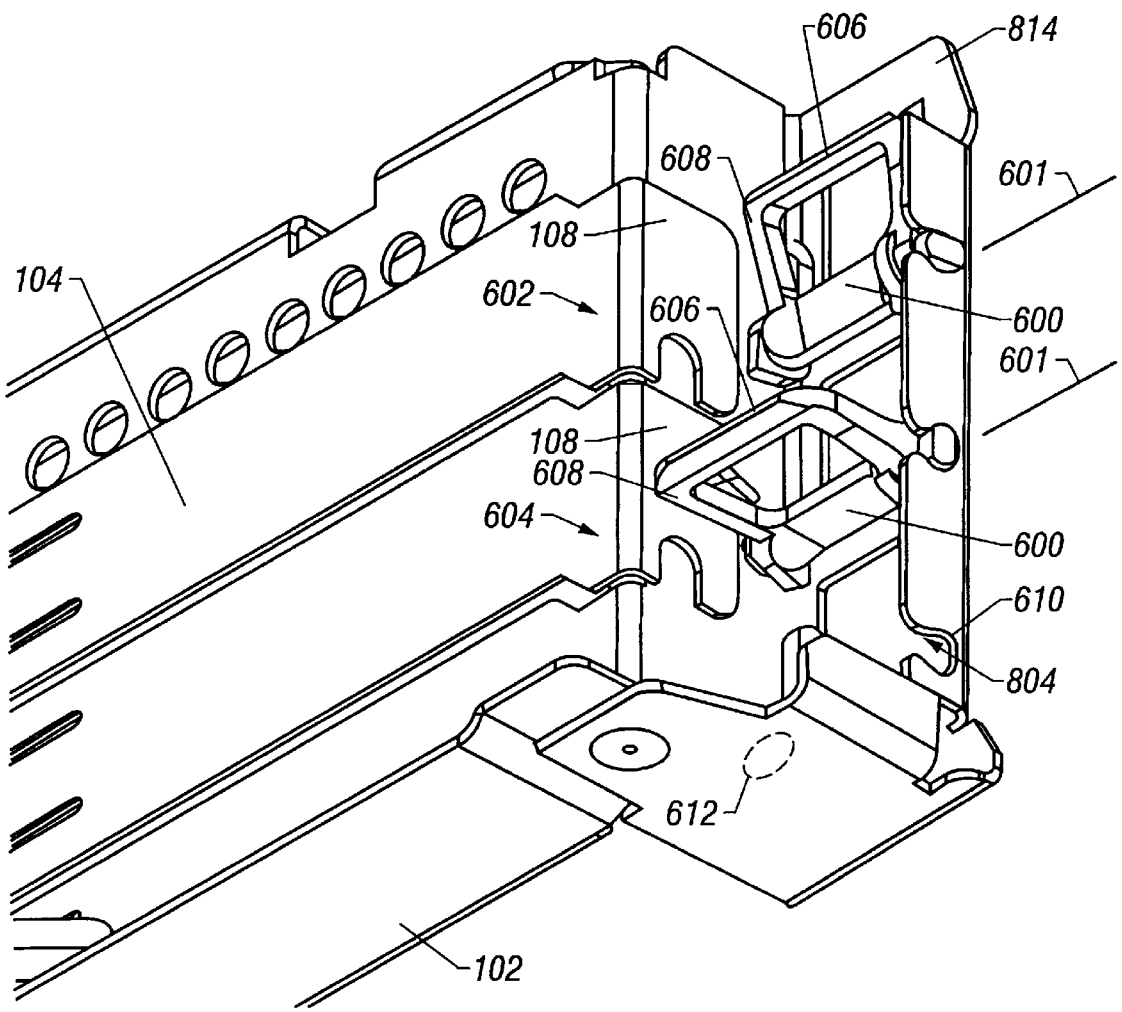
FIG. 6 shows an embodiment of the present invention.

With reference now to FIG. 6, shown is an embodiment of the present invention to be utilized within data processing system 320. Illustrated is expansion card chassis 102 wherein are resident expansion card retaining units 600. Depicted is that each expansion card retaining unit 600 is oriented along a vertical axis 601 and is attached to expansion card chassis 102 at rotation orifices 610 and 612.

The two expansion card retaining units 600 are depicted in two different positions 602, 604. The first position 602 illustrates expansion card retaining unit 600 in an unengaged position; that is, position 602 illustrates a situation in which loading surface 608 of flexible wing, or loop, 606 of expansion card retaining unit 600 is not utilized to secure expansion card 104. The second position 604 shows expansion card retaining unit 600 in an engaged position; that is, position 604 shows a situation in which loading surface 608 of flexible wing, or loop, 606 of expansion card retaining unit has engaged tab 108. In one embodiment, flexible wing, or loop, 606 is formed from a material which combines rigidity, flexibility, and a relatively high coefficient of friction—such as a fiber impregnated polycarbonate. One commercially available example of such a material is Valox DR 48 available from GE Plastics Corporation in Pittfield, Mass.

Figure 7A:
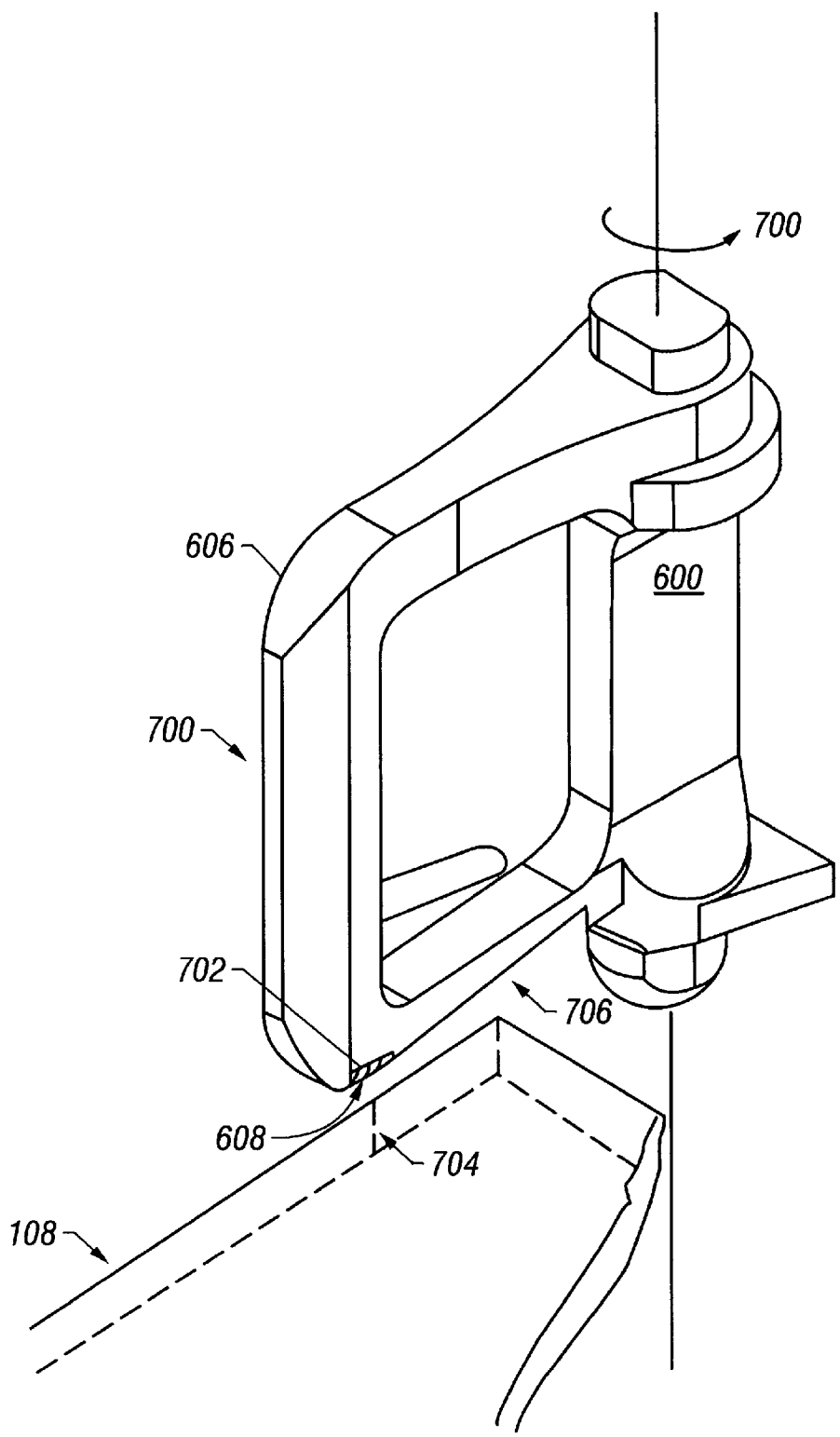
FIGS. 7A–7B depict an expanded view of the manner in which a flexible wing is used to engage and secure a tab of an expansion card.
Figure 7B:
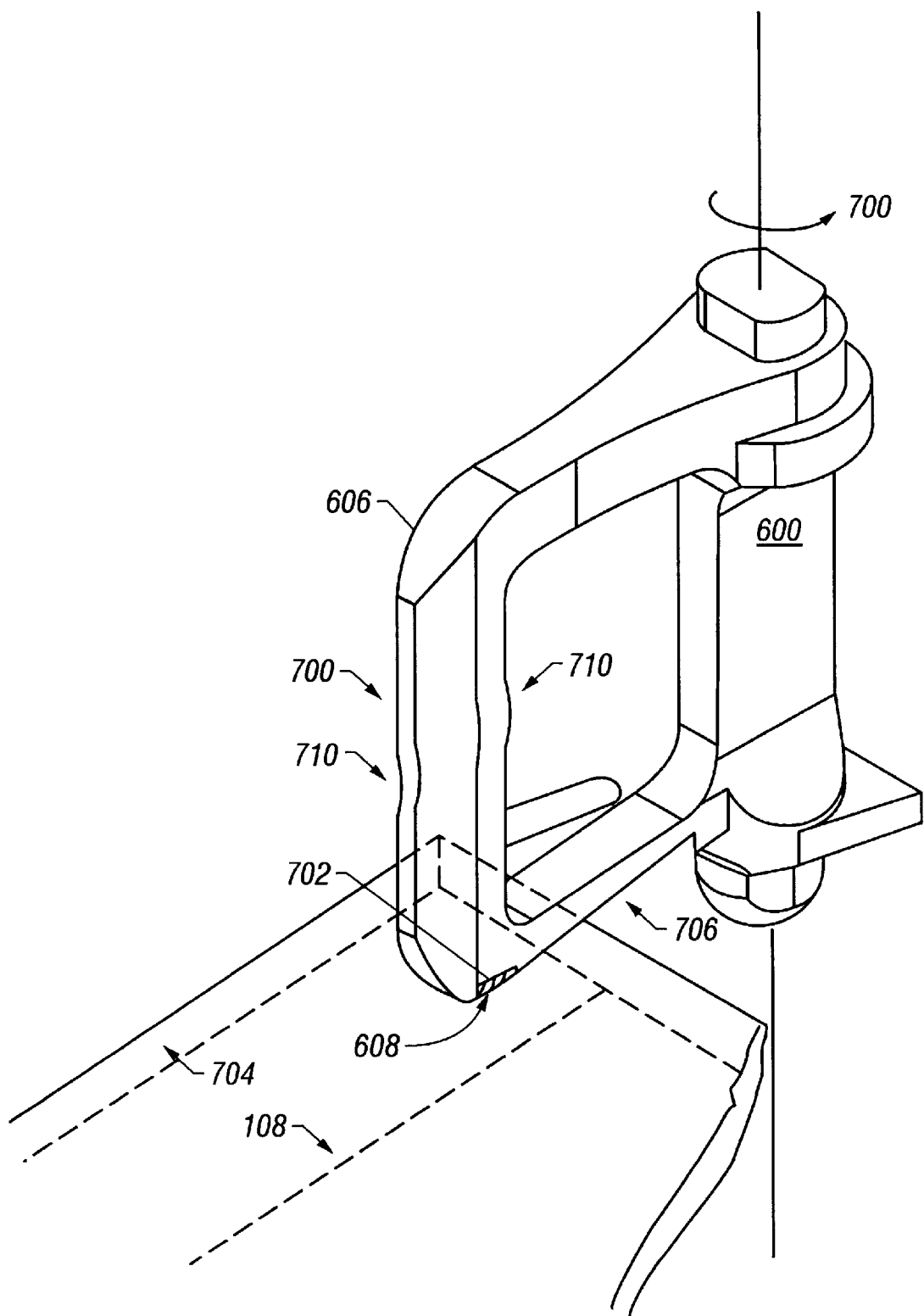

Referring now to FIGS. 7A and 7B, depicted is an expanded view of the manner in which flexible wing 606 is used to engage and secure tab 108. FIG. 7A illustrates the impending movement of flexible wing 606 onto tab 108 of expansion card 104. Shown is that expansion card retention unit 600 is being rotated in direction 700. Depicted is that loading surface 608 of flexible wing 606 is formed such that flexible wing 606 will flex and loading surface 608 will smoothly move onto tab 108; that is, flexible wing 606 is formed such that flexible wing 606 will be able to successfully traverse side 704 of tab 108. In one embodiment, this is achieved by having edge 702 of flexible wing 606 slightly beveled such that flexible wing 606 contact between edge 702 and side 704 of tab 108 and will force flexible wing 606 to wedge up onto tab 108. In another embodiment, this is achieved via triangular-shaped indentation 706 adjacent to loading surface 608, allowing flexible wing 606 to rotate substantially onto tab 108 before loading surface 608 begins to contact tab 108.

FIG. 7B depicts that at some time subsequent to that illustrated in FIG. 7A, flexible wing has successfully been moved onto tab 108. Note that flexible wing 606 is depicted as deforming 710 in shape. This is done to show that flexible wing 606 is absorbing the mechanical load at loading surface 608, where the mechanical load was generated by the wedging action of the movement of flexible wing 606 up onto tab 108. Notice that in the embodiment shown, flexible wing 606 is held in its final rotational position by mechanical friction between flexible wing 606 and tab 108 (this is why the material from which flexible wing is made is preferably one with a relatively high coefficient of friction), which allows a user to move mechanical wing 606 along its rotational arc such that an optimum placement on tab 108 may be achieved.

Figure 8A:
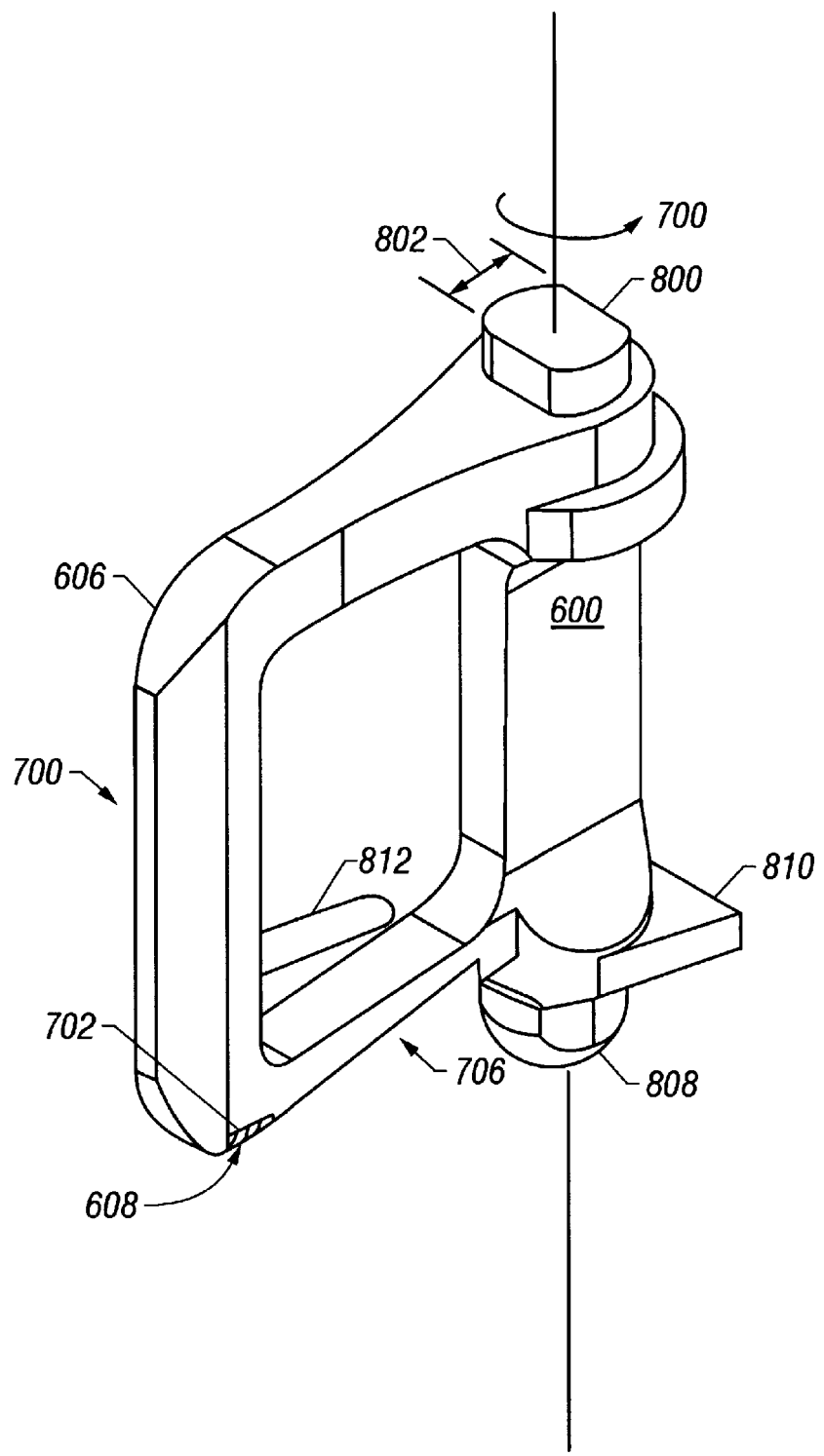
FIGS. 8A–8B show a perspective view of an expansion card retaining unit.
Figure 8B:
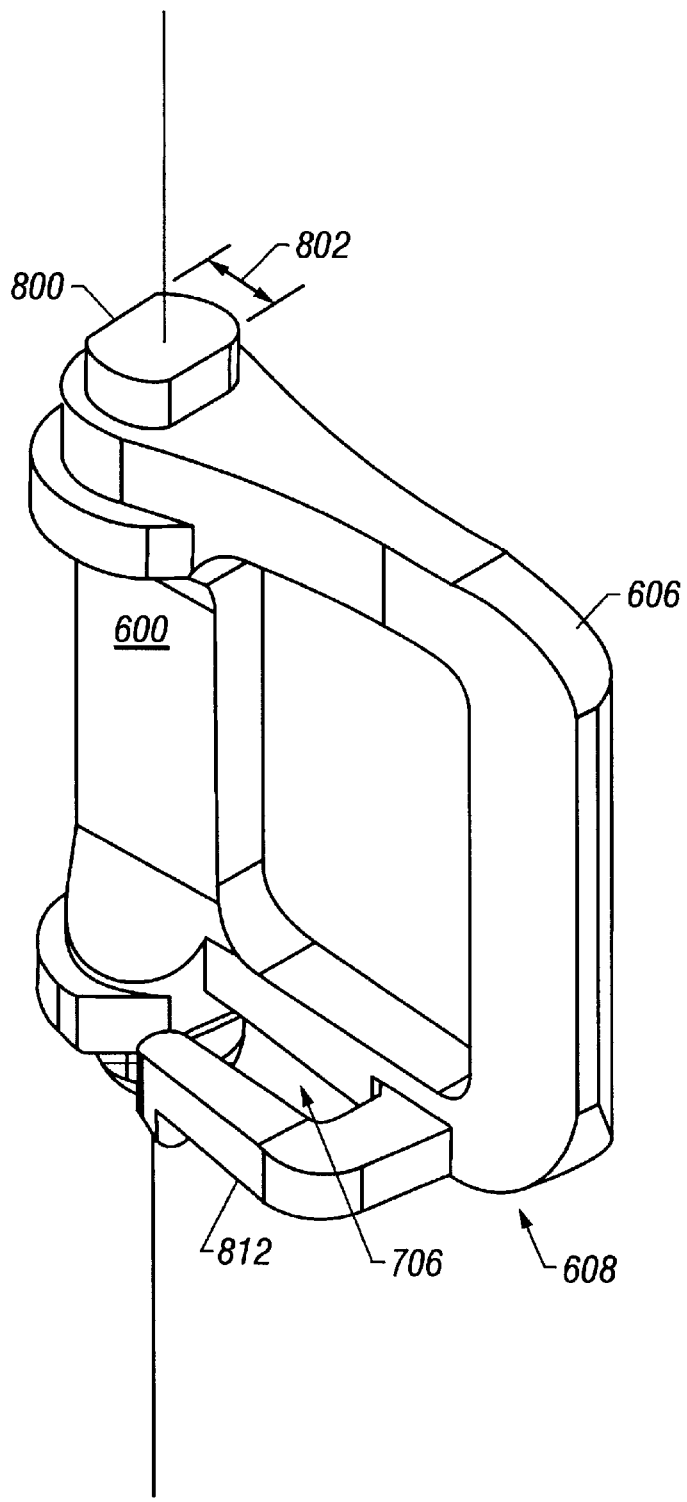

With reference now to FIGS. 8A and 8B, shown is a perspective view of expansion card retaining unit 600. Depicted is expansion card retaining unit 600 formed with a rounded-rectangular first end 800 such that rounded-rectangular first end 800 is transversely oriented relative to flexible wing 606. Rounded-rectangular first end 800 is used to secure expansion card retaining unit 600 in expansion card chassis 102 at rotation orifice 610. Also shown is second end 808 of expansion card retaining unit 600.

Notice that rotation orifice 610 is shaped such that it has opening 804 of a width slightly larger than width portion 802 of rounded-rectangular first end 800 of expansion card retaining unit 600. In one embodiment, second end 808 of expansion card retaining unit 600 is inserted into rotation orifice 612, and thereafter expansion card retaining unit 600 is oriented such that rounded-rectangular first end 800 will be able to pass through opening 804. Thereafter, when expansion card retaining unit 600 is rotated such that flexible loop 606 engages tab 108, width portion 802 will be oriented such that rounded-rectangular first end 800 is held securely in place in first rotation orifice 610 due to the fact that width portion 802 of rounded-rectangular first end 800 is oriented such that it may not pass back through opening 804. This ensures that expansion card retaining unit 600 is held in position within rotation orifice 610 when expansion card retaining unit is engaged.

Illustrated is that expansion card retaining unit 600 has rotation stops 810 and 812. Rotation stops 810 and 812 regulate the maximum rotation of expansion card retaining unit 600. This is done to ensure that rotation is not allowed such that flexible loop 606 can become flush with wall 814 of expansion card chassis 102. Thus, rotation stops 810 and 812 provide for ease of use in that they ensure that flexible loop 606 is virtually always held a distance away from wall 814 of expansion card chassis 102 such that a human user can easily manipulate and rotate flexible loop 606.

Figure 9:
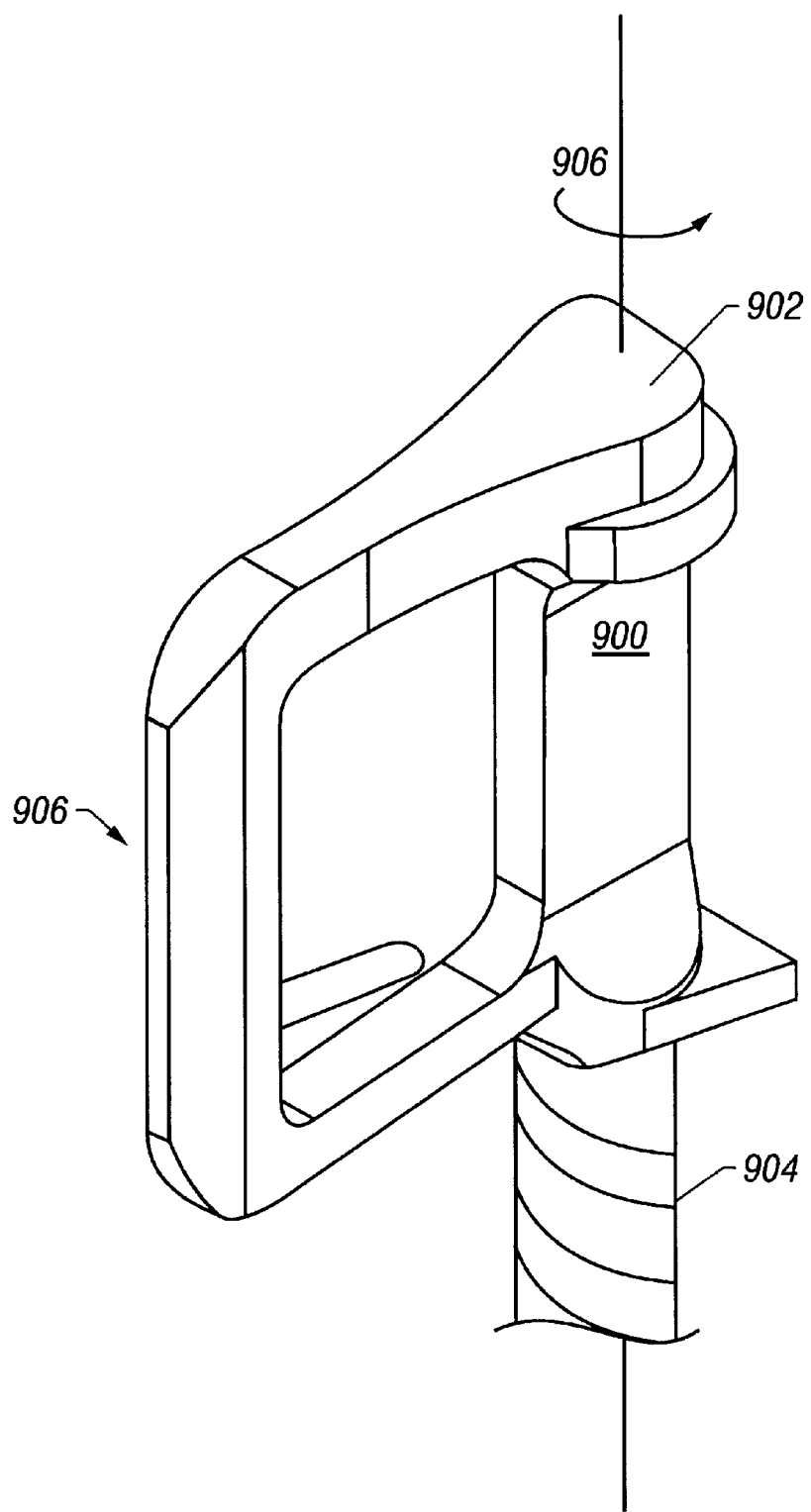
FIG. 9 shows an alternate embodiment of an expansion card retaining unit.

Referring now to FIG. 9, shown is an alternate embodiment of an expansion card retaining unit. Depicted is expansion card retaining unit 900. Illustrated is that expansion card retaining unit is similar to expansion card retaining unit 600, but has had rounded-rectangular first end 800 replaced by first end 902, and second end 808 replaced by threaded-base second end 904.

In this alternate embodiment, threaded-base second end 904 fits within corresponding threads (not shown) within expansion card chassis 102. When expansion card retaining unit is rotated in direction 906, the threads apply force such that flexible loop 606 applies pressure to tab 108. This embodiment gives additional benefit over expansion card retaining unit 600 in that the force supplied by the screw thread can be added to the force supplied by the wedging action described in relation to expansion card retaining unit 600. In another embodiment (not shown), first end 902 is formed to function substantially as rounded-rectangular first end 800, which gives that added advantage of more stability for expansion card retaining unit 900 and relieves some the mechanical stress upon the threads (not shown) within expansion card chassis 102.

Other embodiments are contemplated within the spirit of the foregoing description. For example, alternate embodiments wherein loop 606 is replaced with a solid piece of material having appropriate mechanical properties are contemplated. Also contemplated are embodiments of the present invention where loop 606 is replace by a composite of two or more material where at least one of the materials is appropriate to absorb the loading generated by the wedging or screwing actions, described above. Also contemplated is the use of sub-optimum materials (e.g., metal or metallic substances) to achieve roughly the same operative effect of materials having appropriate mechanical properties. Another embodiment contemplates a locking pin which will "lock" an expansion card retaining device into fixed position when the expansion card retaining device is engaged.

The foregoing described embodiments depict different components contained within, or connected with, different other components. It is to be understood that such depicted architectures are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when same claim includes the introductory phrases "one or more" or "at least one" and indefinite articles such as "a" or "an"; the same holds true for the use of definite articles used to introduce claim elements.

What is claimed is:

1. An expansion card retention system comprising:
   an expansion card retaining unit having a vertical axis said expansion card retaining unit having an extended member; and
   a vertical-axis extended member pressure application device integrated with said extended member, wherein said vertical-axis extended member pressure application device is structured to apply pressure to an expansion card in a direction substantially parallel to the vertical axis.

2. The system of claim 1, wherein the extended member further includes:
   a flexible extended member.

3. The system of claim 2, wherein said flexible extended member further includes:
   a flexible loop.

4. The system of claim 2, wherein said flexible extended member further includes:
   the flexible extended member formed at least in part from fiber impregnated polycarbonate.

5. The system of claim 2, wherein said flexible extended member further includes:
   the flexible extended member formed at least in part from plastic.

6. The system of claim 2, wherein said flexible extended member further includes:
   the flexible extended member formed at least in part from metal.

7. The system of claim 1, wherein said vertical-axis extended member pressure application device integrated with said extended member further includes:
   said extended member structured to wedge onto an expansion card.

8. The system of claim 7, wherein said extended member structured to wedge onto an expansion card further includes:
   a flexible extended member structured in a flexible loop.

9. The system of claim 8, wherein said flexible extended member structured in a flexible loop further includes:
   the flexible loop structured to have at least one segment sufficient to allow the flexible loop to wedge onto the expansion card.

10. The system of claim 8, wherein said flexible extended member structured as a flexible loop further includes:
    the flexible loop formed to have a triangular-shaped indentation sufficient to allow the flexible loop to wedge onto the expansion card.

11. The system of claim 8, wherein said flexible extended member structured in a flexible loop further includes:
    the flexible loop formed to have an edge sufficient to allow the flexible loop to wedge onto the expansion card.

12. The system of claim 8, wherein said flexible extended member structured in a flexible loop further includes:
    the flexible loop operably connected to a screw force application mechanism.

13. The system of claim 7, wherein the extended member further includes:
    a flexible extended member.

14. The system of claim 13, wherein said flexible extended member further includes:
    the flexible extended member formed at least in part from fiber impregnated polycarbonate.

15. The system of claim 13, wherein said flexible extended member further includes:
    the flexible extended member formed at least in part from plastic.

16. The system of claim 13, wherein said flexible extended member further includes:
    the flexible extended member formed at least in part from metal.

17. A computer system comprising:
    an expansion card retention device comprising:
      an expansion card retaining unit having a vertical axis said expansion card retaining unit having an extended member; and
      a vertical-axis extended member pressure application device integrated with said extended member, wherein said vertical-axis extended member pressure application device is structured to apply pressure to an expansion card in a direction substantially parallel to the vertical axis;
    an operating system;
    a processing unit;
    a first bridge;
    a system memory; and
    an input-output bus.

18. The computer system of claim 17, further comprising:
    a graphics bus;
    a graphics controller;
    a local frame buffer;
    a display device;
    an input-output bridge; and
    a network card.

19. The computer system of claim 17, further comprising:
    a hard drive;
    a digital camera;
    a microphone; and
    videoconferencing software.

20. The system of claim 17, wherein the extended member further includes:
    a flexible extended member.

21. The system of claim 20, wherein said flexible extended member further includes:
    a flexible loop.

22. The system of claim 20, wherein said flexible extended member further includes:
   the flexible extended member formed at least in part from (a) fiber impregnated polycarbonate, or (b) plastic, or (c) metal.

23. The system of claim 20, wherein the extended member further includes:
   a flexible extended member.

24. The system of claim 23, wherein said flexible extended member further includes:
   the flexible extended member formed at least in part from (a) fiber impregnated polycarbonate, or (b) plastic, or (c) metal.

25. The system of claim 17, wherein said vertical-axis extended member pressure application device integrated with said extended member further includes:
   said extended member structured to wedge onto an expansion card.

26. The system of claim 25, wherein said extended member structured to wedge onto an expansion card further includes:
   a flexible extended member structured in a flexible loop.

27. The system of claim 26, wherein said flexible extended member structured in a flexible loop further includes:
   the flexible loop structured to have at least one segment sufficient to allow the flexible loop to wedge onto the expansion card.

28. The system of claim 26, wherein said flexible extended member structured as a flexible loop further includes:
   the flexible loop formed to have a triangular-shaped indentation sufficient to allow the flexible loop to wedge onto the expansion card.

29. The system of claim 26, wherein said flexible extended member structured in a flexible loop further includes:
   the flexible loop formed to have an edge sufficient to allow the flexible loop to wedge onto the expansion card.

30. The system of claim 26, wherein said flexible extended member structured in a flexible loop further includes:
   the flexible loop operably connected to a screw force application mechanism.

31. A method comprising:
   securing an expansion card via the application of a wedging force, wherein said securing an expansion card via the application of a wedging force further includes placing an extended member upon the expansion card, said extended member structured to apply pressure to a surface of an expansion card in a direction substantially parallel to a vertical axis relative to a horizontal axis substantially defined by the surface of the expansion card.

32. The method of claim 20, wherein said placing an extended member upon the expansion card further includes:
   rotating the extended member about the vertical axis.

33. The method of claim 32, wherein said rotating the extended member about the vertical axis further includes:
   rotating a flexible extended member about the vertical axis such that the flexible extended member wedges onto the expansion card.

34. The method of claim 33, wherein said rotating a flexible extended member about the vertical axis such that the flexible extended member wedges onto the expansion card further includes:
   rotating a flexible extended member formed at least in part from fiber impregnated polycarbonate about the vertical axis such that the flexible extended member wedges onto the expansion card.

35. The method of claim 33, wherein said rotating a flexible extended member about the vertical axis such that the flexible extended member wedges onto the expansion card further includes:
   rotating a flexible extended member formed at least in part from plastic about the vertical axis such that the flexible extended member wedges onto the expansion card.

36. The method of claim 33, wherein said rotating a flexible extended member about the vertical axis such that the flexible extended member wedges onto the expansion card further includes:
   rotating a flexible extended member formed at least in part from metal about the vertical axis such that the flexible extended member wedges onto the expansion card.

37. The method of claim 33, wherein said rotating a flexible extended member about the vertical axis such that the flexible extended member wedges onto the expansion card further includes:
   rotating a flexible extended member structured to facilitate wedging about the vertical axis such that the flexible extended member wedges onto the expansion card.

38. The method of claim 37, wherein said rotating a flexible extended member structured to facilitate wedging about the vertical axis such that the flexible extended member wedges onto the expansion card further includes:
   rotating a flexible extended member formed to have a triangular-shaped indentation sufficient to allow the flexible loop to wedge onto the expansion card about the vertical axis such that the flexible extended member wedges onto the expansion card.

39. The method of claim 37, wherein said rotating a flexible extended member structured to facilitate wedging about the vertical axis such that the flexible extended member wedges onto the expansion card further includes:
   rotating a flexible extended member formed to have an edge sufficient to allow the flexible loop to wedge onto the expansion card about the vertical axis such that the flexible extended member wedges onto the expansion card.

* * * * *